(12) United States Patent
Bernhardt et al.

(10) Patent No.: US 12,330,478 B2
(45) Date of Patent: Jun. 17, 2025

(54) HEATING ARRANGEMENT

(71) Applicant: Vitesco Technologies GmbH, Regensburg (DE)

(72) Inventors: Andreas Bernhardt, Munich (DE); Frank Baur, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 757 days.

(21) Appl. No.: 17/762,824

(22) PCT Filed: Sep. 23, 2020

(86) PCT No.: PCT/EP2020/076472
§ 371 (c)(1),
(2) Date: Mar. 23, 2022

(87) PCT Pub. No.: WO2021/058507
PCT Pub. Date: Apr. 1, 2021

(65) Prior Publication Data
US 2022/0339990 A1 Oct. 27, 2022

(30) Foreign Application Priority Data
Sep. 24, 2019 (DE) .................... 10 2019 214 566.3

(51) Int. Cl.
*B60H 1/22* (2006.01)
*H05B 3/06* (2006.01)
(Continued)

(52) U.S. Cl.
CPC ............ *B60H 1/2215* (2013.01); *H05B 3/06* (2013.01); *H05B 3/46* (2013.01); *H05K 1/147* (2013.01);
(Continued)

(58) Field of Classification Search
CPC ........ H05B 2203/003; H05B 2203/013; H05B 2203/017; H05B 2203/021; H05B 3/06;
(Continued)

(56) References Cited

U.S. PATENT DOCUMENTS 7,361,869 B2 4/2008 Russegger
10,052,066 B2 8/2018 Rogers et al.
(Continued)

FOREIGN PATENT DOCUMENTS

CN 105283122 A 1/2016
CN 109210766 A 1/2019
(Continued)

*Primary Examiner* — Vy T Nguyen
(74) *Attorney, Agent, or Firm* — Laurence A. Greenberg; Werner H. Stemer; Ralph E. Locher

(57) ABSTRACT

A heating arrangement has a coolant housing with an inflow connection and an outflow connection for a coolant. Heating elements are arranged on opposite housing walls and include connections for the supply of power. Three circuit-board pieces of a circuit board are arranged in a row and connected to one another via flexible regions. Power electronic components and connections for connecting to the power-supply connections of the heating elements are arranged on the two edge circuit-board pieces. The circuit board is bent in flexible regions such that the two edge circuit-board pieces lie opposite one another. The coolant housing lies between the opposite edge circuit-board pieces. The power-supply connections of the heating elements and the connections on the edge circuit-board pieces are in electrical contact.

4 Claims, 1 Drawing Sheet

(51) Int. Cl.
*H05B 3/46* (2006.01)
*H05K 1/14* (2006.01)

(52) U.S. Cl.
CPC .. *H05B 2203/003* (2013.01); *H05B 2203/013* (2013.01); *H05B 2203/017* (2013.01)

(58) Field of Classification Search
CPC . H05B 3/42; H05B 3/46; H05K 1/147; H05K 2201/056; H05K 3/4691; F24H 1/009; F24H 9/1818; B60H 1/2215
See application file for complete search history.

(56) References Cited

U.S. PATENT DOCUMENTS

| | | |
|---|---|---|
| 11,032,903 B2 | 6/2021 | Maurech et al. |
| 2003/0156829 A1 | 8/2003 | Cox et al. |
| 2004/0112884 A1 | 6/2004 | Uhl et al. |
| 2014/0287293 A1* | 9/2014 | Gross .................. H01M 10/615 |
| | | 429/120 |
| 2017/0119050 A1 | 5/2017 | Blandino et al. |
| 2018/0025808 A1 | 1/2018 | Hashimoto et al. |
| 2018/0325173 A1 | 11/2018 | Blandino et al. |
| 2020/0156443 A1 | 5/2020 | Ding et al. |
| 2020/0281072 A1* | 9/2020 | Maurech ............... H05K 7/1417 |
| 2021/0318026 A1 | 10/2021 | Eckert et al. |

FOREIGN PATENT DOCUMENTS

| | | |
|---|---|---|
| DE | 20319024 U1 | 3/2004 |
| DE | 102011057105 A1 | 7/2013 |
| DE | 102017129026 B3 | 4/2019 |
| EP | 0149332 A2 | 7/1985 |
| EP | 1459332 A2 | 9/2004 |
| EP | 1459332 B1 | 11/2008 |
| EP | 3096587 A1 | 11/2016 |
| WO | 2019001585 A1 | 1/2019 |
| WO | 2019115123 A1 | 6/2019 |

* cited by examiner

HEATING ARRANGEMENT

FIELD AND BACKGROUND OF THE INVENTION

Electric heating apparatuses are frequently used in motor vehicles, for instance as supplementary heaters in order to augment the heating of the motor vehicle interior and other components achieved primarily through the heat produced by the engine, or, for instance, to allow heating even when the vehicle is stationary. Electric heating apparatuses are particularly important in vehicles that have an electric or hybrid drive, in which the motor-vehicle drive unit does not output any heat, or insufficient heat, to warm or air-condition the vehicle. It is advantageous if a heating apparatus for electric or hybrid vehicles is also suited, in addition to supplying the heat required to warm the motor-vehicle interior, to providing the heat required for, or at least facilitating, the processes running in individual system parts of the motor vehicle, for instance for preheating the vehicle battery.

DE 10 2011 057 105 A1 discloses an electric heating element having a heat exchanger designed to transfer heat to a medium to be heated. The heat exchanger has a surface which, for the purpose of heat transfer, is connected directly to the medium to be heated. Here, the surface of the heat exchanger is provided with a plurality of ribs or protrusions, for example, in order to achieve better heat transfer to the medium to be heated. The heat exchanger is made of a material of high thermal conductivity, and can be made in particular of metal, in particular a metal such as aluminium, copper, an aluminium alloy or a copper alloy. The heat exchanger is designed to transfer heat to a fluid as a medium to be heated. In this case, the medium to be heated may be in particular air or a fluid in a fluid circuit of a vehicle, in particular a coolant. This heat exchanger also doubles as a substrate, on the rear face of which is applied by means of a coating process an electrically insulating layer of high thermal conductivity. The electrically insulating layer in particular can be made of $Al_2O_3$ and can be applied by a spraying process, in particular by thermal spraying. On the side of the electrically insulating layer facing away from the heat exchanger is applied by means of a coating process an electrically conducting resistive layer, which is patterned as one or more conductor tracks. The electrically conducting resistive layer is designed such that a voltage can be applied thereto in order to convert electrical energy into thermal energy. The electrically conducting resistive layer can be applied by a spraying process, for example. The side of the electrically conducting resistive layer facing away from the heat exchanger is in turn provided with an electrically insulating layer, likewise applied by means of a coating process. The electrically insulating layer can be formed from the same material as the electrically insulating layer, in particular from $Al_2O_3$.

The electric heating element can be produced here by a method as described in EP 1 459 332 B1, for example. This discloses a method for producing an electrically conducting resistive layer, in which method an electrically conducting material is applied to a non-conducting underlying surface by means of thermal spraying, plasma spraying, high-velocity flame spraying, wire arc spraying, high-velocity oxy-fuel spraying, laser spraying or cold spraying, wherein the electrically conducting material is applied over the surface so as to produce a material layer that initially does not substantially have a desired shape, and subsequently portions of the material layer are removed so as to form an electrically conducting resistive layer that substantially has the desired shape, wherein the localized electrical resistance of the electrically conducting resistive layer is adjusted by local heat treatment in which local oxides are introduced into the layer. The removal of portions of the material layer can be performed by laser radiation, a water jet or a sand-blasting jet in order that at least portions of the electrically conducting resistive layer have a meandering form.

DE 203 19 024 U1 discloses a planar heating element which is in the form of a resistive heater having a multilayer construction and which converts supplied electrical energy into thermal energy, which it outputs to a substrate material of the planar heating element. The substrate material has a surface that is flat, curved or of multidimensional shape, and screen-printing processes are used to apply a heat-generating electrical conductor to the substrate material to be heated. Over the electrical conductor is applied a plastics-based insulating layer by means of screen-printing processes or by spraying or rolling, and the insulating layer is dried and cured at maximum temperatures of 300° C. The substrate material may consist of an electrically insulating material such as plastics, metal oxide, metal nitrite, or of an electrically conducting substrate on which has been applied in a previous manufacturing step an electrically insulating covering, for example made of enamel or glass. It can also, however, consist of an electrically conducting material such as aluminium, copper or steel, with a plastics-based insulating layer applied on the substrate material between the substrate material and the heat-generating electrical conductor, which insulating layer has been dried and cured at maximum temperatures of 300° C. The heat-generating electrical conductor may be a conductive paste made of a carbon conductive paint having a solids content of more than 60% and containing, in addition to coal dust, also graphite of particle size of preferably 5 to 7 μm. The insulating layer can consist of solder resist or electrically insulating varnish or impregnating varnish for electrical and/or electronic components. The heat-generating electrical conductor can be formed over the whole surface or as a conductor-track pattern of any geometry.

The heating elements described here, which are applied to one side of a coolant housing, often cannot deliver the required heating performance, however. On the other hand, supplying power is problematic for heating elements applied on multiple sides.

Therefore the object of the invention is to provide a solution here.

SUMMARY OF THE INVENTION

The object is achieved by a heating arrangement as claimed. Advantageous developments are specified in the dependent claims.

Accordingly, a heating arrangement according to the invention is formed having a coolant housing having an inflow connection and an outflow connection for a coolant, and having heating elements, which are arranged on at least two opposite housing walls and comprise connections for the supply of power, and also having a circuit board in at least three pieces, the three circuit-board pieces of which are arranged in a row and connected to one another via flexible regions, wherein power electronic components and connections for connecting to the power-supply connections of the heating elements are arranged on the two edge circuit-board pieces, wherein the circuit board is bent by means of the flexible regions in such a way that the two edge circuit-board pieces lie opposite one another, and wherein the coolant housing is arranged between the opposite edge circuit-board pieces, and the power-supply connections of the heating elements and the connections on the edge circuit-board pieces are in electrical contact.

This results in a reduction in area by virtue of the space-saving arrangement of the electronics, and in an increase in the heating performance by virtue of the arrangement of heating elements on at least two opposite faces of the coolant housing. Furthermore, a very short connection of the two heating elements to the power electronics is possible, and it is also possible to isolate easily the circuit part for signal processing from the circuit part for the power electronics, which carries a high voltage (400 V/800 V).

It would also be easily possible to provide further heating elements on the other two housing walls that are also opposite one another, and to supply these via two further edge circuit-board pieces, which are likewise flexibly connected to the central circuit-board piece. The circuit board would then have the shape of a cross in plan view when not in the bent state.

In an advantageous embodiment of the heating arrangement, a logic circuit is arranged on the central circuit-board piece.

It is thereby possible to supply control signals easily to all the edge circuit-boards connected to the central circuit-board piece.

In one embodiment of the heating arrangement, the heating elements are formed by heating rods. Alternatively, the heating elements can also be formed by spray-applied resistive meanders. In principle, other above-described heating elements are also possible.

BRIEF DESCRIPTION OF THE FIGURES

The invention shall be described in more detail below with reference to an exemplary embodiment with the aid of figures, in which.

DETAILED DESCRIPTION OF THE INVENTION

Figure 1:
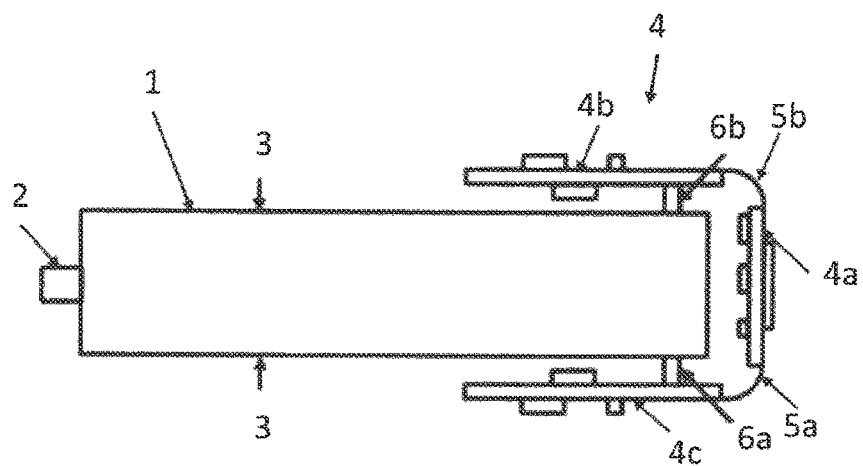
FIG. 1 shows a heating arrangement according to the invention.

FIG. 1 shows schematically a coolant housing 1, which has an inflow connection and an outflow connection 2 for a coolant, of which only one is shown in the diagram, however.

Heating elements 3 (not shown in detail), which may be in the form of resistive meanders, for instance, are arranged on the upper face and lower face of the coolant housing 1. It would also be possible to provide further heating elements on the front face and rear face (from the perspective of the viewer of FIG. 1) and possibly even on the end face.

Figure 2:
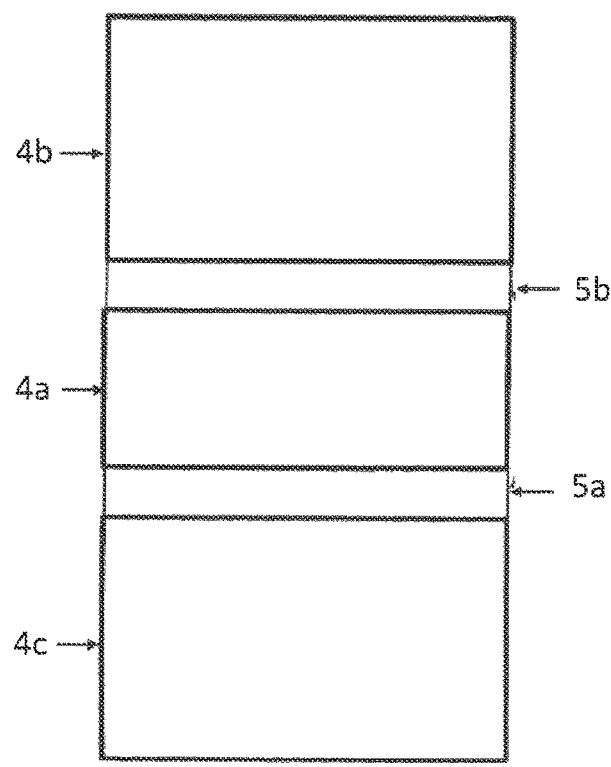
FIG. 2 shows a three-piece circuit board.

A circuit board 4 is shown as a three-piece circuit board, and hence comprises a central circuit-board piece 4a and two edge circuit-board pieces 4b, 4c. The three circuit-board pieces 4a, 4b, 4c are connected to one another via flexible regions 5a, 5b; this is shown schematically in FIG. 2. In the exemplary embodiment, the central circuit-board piece 4a is intended to be provided with logic circuits (and/or analog circuits) for signal provision and signal processing, whereas the edge circuit-board pieces 4b, 4c carry mainly power electronic circuits. They also comprise connections 5a, 5b, by means of which they are connected to power-supply connections of the heating elements 3 in order to supply power thereto.

The heating arrangement shown in FIG. 1 thus allows a highly compact, space-saving yet high-performance design.

The invention claimed is:

1. A heating arrangement, comprising:
   a coolant housing having an inflow connection and an outflow connection for a coolant;
   heating elements arranged on at least two opposite housing walls of said coolant housing, said heating elements having power supply connections;
   a circuit board with at least three circuit board pieces, said circuit-board pieces being disposed in a row and being connected to one another via flexible regions, said circuit board pieces including two edge circuit-board pieces carrying power electronic components and connections for connecting to said power-supply connections of said heating elements;
   said circuit board being bent at said flexible regions to arrange said two edge circuit-board pieces to lie opposite one another; and
   wherein said coolant housing is disposed between said edge circuit-board pieces, and wherein said power-supply connections of said heating elements and said connections on said edge circuit-board pieces are in electrical contact with one another.

2. The heating arrangement according to claim 1, wherein said at least three circuit-board pieces include a central circuit-board piece carrying a logic circuit on said central circuit-board piece.

3. The heating arrangement according to claim 1, wherein said heating elements are heating rods.

4. The heating arrangement according to claim 1, wherein said heating elements are formed by spray-applied resistive meanders.

* * * * *